(12) United States Patent
Herman et al.

(10) Patent No.: US 11,471,808 B2
(45) Date of Patent: Oct. 18, 2022

(54) IMPULSE TURBINE WITH NON-WETTING SURFACE FOR IMPROVED HYDRAULIC EFFICIENCY

(71) Applicant: CUMMINS FILTRATION IP, INC., Columbus, IN (US)

(72) Inventors: Peter K. Herman, Stoughton, WI (US); Arun P. Janakiraman, Janesville, WI (US)

(73) Assignee: CUMMINS FILTRATION IP, INC., Columbus, IN (US)

( * ) Notice: Subject to any disclaimer, the term of this patent is extended or adjusted under 35 U.S.C. 154(b) by 152 days.

(21) Appl. No.: 16/474,742

(22) PCT Filed: Jan. 8, 2018

(86) PCT No.: PCT/US2018/012762
§ 371 (c)(1),
(2) Date: Jun. 28, 2019

(87) PCT Pub. No.: WO2018/129438
PCT Pub. Date: Jul. 12, 2018

(65) Prior Publication Data
US 2019/0321765 A1     Oct. 24, 2019

Related U.S. Application Data

(60) Provisional application No. 62/443,991, filed on Jan. 9, 2017.

(51) Int. Cl.
*B01D 46/26* (2006.01)
*B01D 45/12* (2006.01)
(Continued)

(52) U.S. Cl.
CPC ......... *B01D 46/0056* (2013.01); *B01D 45/12* (2013.01); *B01D 46/003* (2013.01);
(Continued)

(58) Field of Classification Search
CPC .. B01D 46/0056; B01D 45/12; B01D 46/003; B01D 46/2403; B01D 46/26;
(Continued)

(56) References Cited

U.S. PATENT DOCUMENTS

| 1,681,705 A | 8/1928 | Moody |
| 2,390,506 A | 12/1945 | Buchi |

(Continued)

FOREIGN PATENT DOCUMENTS

| CN | 103879084 | 6/2014 |
| EP | 2 638 944 | 9/2013 |

(Continued)

OTHER PUBLICATIONS

International Search Report and Written Opinion issued for PCT/US2017/064268, dated Feb. 12, 2018, 8 pages.

(Continued)

*Primary Examiner* — Jacob M Amick
(74) *Attorney, Agent, or Firm* — Foley & Lardner LLP (57) ABSTRACT

Various arrangements of a turbine for a rotating coalescer element of a crankcase ventilation system for an internal combustion engine are described. In some arrangements, the turbine is an impulse turbine, which is also known as a pelton turbine or a turgo turbine. The turbine is used to convert hydraulic power from a stream of pressurized fluid to mechanical power that is used to drive the rotating element. The turbine includes a non-wetting surface (e.g., an oleophobic or hydrophobic surface) that repels the pressurized fluid. The non-wetting surface may be achieved through plasma coating, fluoropolymer coating, micro-topography features, and the like. The non-wetting surface increases the power transmission efficiency from the stream of pressurized fluid to the turbine, thereby increasing the rotational speed of the rotating element compared to wettable surfaced (Continued)

turbines, which in turn increases the efficiency of the rotating element.

22 Claims, 10 Drawing Sheets

(51) Int. Cl.
*F01M 13/04* (2006.01)
*B01D 46/00* (2022.01)
*B01D 46/24* (2006.01)
*B04B 9/06* (2006.01)
*C23C 28/02* (2006.01)

(52) U.S. Cl.
CPC ......... *B01D 46/2403* (2013.01); *B01D 46/26* (2013.01); *B04B 9/06* (2013.01); *C23C 28/02* (2013.01); *F01M 13/04* (2013.01); *F01M 2013/0422* (2013.01); *F05B 2210/11* (2013.01); *F05B 2230/312* (2013.01); *F05B 2230/314* (2013.01); *F05B 2240/244* (2013.01); *F05B 2240/2411* (2013.01); *F05B 2240/32* (2013.01)

(58) Field of Classification Search
CPC ...... B01D 46/0052; B01D 45/14; B04B 9/06; C23C 28/02; F01M 13/04; F01M 2013/0422; F05B 2210/11; F05B 2230/312; F05B 2230/314; F05B 2240/2411; F05B 2240/244; F05B 2240/32
See application file for complete search history.

(56) References Cited

U.S. PATENT DOCUMENTS

| | | |
|---|---|---|
| 2,577,179 A | 12/1951 | Buchi |
| 2,607,438 A | 8/1952 | Bailey |
| 2,663,541 A | 12/1953 | Geen |
| 3,041,039 A | 6/1962 | Ambroz |
| 4,279,624 A | 7/1981 | Wilson |
| 4,634,344 A | 1/1987 | Zagar et al. |
| 6,017,300 A | 1/2000 | Herman |
| 6,019,717 A | 2/2000 | Herman |
| 6,071,300 A | 6/2000 | Brenneman et al. |
| 6,213,929 B1 | 4/2001 | May |
| 6,925,993 B1 | 8/2005 | Eliasson et al. |
| 9,322,307 B2 | 4/2016 | Andersson |
| 2002/0098083 A1 | 7/2002 | Blangetti et al. |
| 2004/0213675 A1 | 10/2004 | Blangetti et al. |
| 2004/0219022 A1 | 11/2004 | Yang |
| 2006/0039791 A1 | 2/2006 | Kim |
| 2006/0093485 A1 | 5/2006 | Horng et al. |
| 2009/0175729 A1 | 7/2009 | Sun |
| 2011/0180051 A1 | 7/2011 | Schwandt et al. |
| 2013/0032646 A1 | 2/2013 | Dhiman et al. |
| 2013/0056407 A1* | 3/2013 | Parikh ..................... F02D 23/00 210/360.1 |
| 2013/0094939 A1 | 4/2013 | Farb et al. |
| 2013/0327010 A1 | 12/2013 | Muller et al. |
| 2014/0147631 A1* | 5/2014 | Yang ........................ B05D 5/08 428/143 |
| 2015/0003996 A1 | 1/2015 | Krishna et al. |
| 2015/0037134 A1 | 2/2015 | Isaev |
| 2015/0203687 A1* | 7/2015 | Pardon ..................... C09D 4/00 428/421 |
| 2015/0246477 A1* | 9/2015 | Bormashenko ......... B29C 59/14 428/141 |
| 2016/0169226 A1 | 6/2016 | Jenkins et al. |

FOREIGN PATENT DOCUMENTS

| | | |
|---|---|---|
| GB | 0 468 557 A | 7/1937 |
| GB | 0 938 967 A | 10/1963 |
| GB | 2 058 941 | 7/1980 |
| GB | 2 455 816 | 6/2009 |
| WO | WO-2007/110059 | 10/2007 |
| WO | WO-2009/050462 A2 | 4/2009 |
| WO | WO-2016/200928 A1 | 12/2016 |

OTHER PUBLICATIONS

International Search Report and Written Opinion issued for PCT/US2019/027615, dated Jun. 25, 2019, 18 pages.
International Search Report and Written Opinion for PCT Application No. PCT/US2018/012762, dated Mar. 26, 2018, pp. 1-7.
International Search Report and Written Opinion for PCT Application No. PCT/US2019/016406, dated Apr. 22, 2019, pp. 1-9.
International Search Report and Written Opinion for PCT Application No. PCT/US2017/064269, dated Feb. 12, 2018, pp. 1-8.
First Office Action issued for Chinese Patent Application No. 201880006007.0, dated Feb. 26, 2021, 9 pages.

* cited by examiner

IMPULSE TURBINE WITH NON-WETTING SURFACE FOR IMPROVED HYDRAULIC EFFICIENCY

CROSS-REFERENCE TO RELATED PATENT APPLICATIONS

This application is the U.S. national phase of PCT Application No. PCT/US2018/012762, filed Jan. 8, 2018, claims priority to and the benefit of U.S. Provisional Patent Application No. 62/443,991, filed Jan. 9, 2017 and entitled "Impulse Turbine with Non-Wetting Surface for Improved Hydraulic Efficiency," the entire disclosure of which is incorporated herein by reference.

TECHNICAL FIELD

The present application relates to rotating separators.

BACKGROUND

During operation of an internal combustion engine, a fraction of combustion gases can flow out of the combustion cylinder and into the crankcase of the engine. These gases are often called "blowby" gases. The blowby gases include a mixture of aerosols, oils, and air. If vented directly to the ambient, the aerosols contained in the blowby gases can harm the environment. Accordingly, the blowby gases are often routed out of the crankcase via a crankcase ventilation system. The crankcase ventilation system may pass the blowby gases through a coalescer (i.e., a coalescing filter element) to remove a majority of the aerosols and oils contained in the blowby gases. The filtered blowby gases ("clean" gases) are then either vented to the ambient (in open crankcase ventilation systems) or routed back to the air intake for the internal combustion engine for further combustion (in closed crankcase ventilation systems).

Some crankcase ventilation systems utilize rotating coalescer elements that increase the filter efficiency of the crankcase ventilation systems by rotating the coalescer element during filtering. In rotating coalescer elements, the contaminants (e.g., oil droplets suspended and transported by blowby gases) are separated at least in part by centrifugal separation techniques. Additionally, the rotation of the coalescer element can create a pumping effect, which reduces the pressure drop through the crankcase ventilation system. The coalescer element may include, for example, filter media, stacks of separating cones, stacks of separating discs, or a combination thereof. The coalescer element can be rotated by a fluid driven turbine coupled to the coalescer element.

SUMMARY

Various example embodiments relate to a turbine used to drive a rotating element in a filtration system. The turbine includes a central body and a plurality of buckets coupled to the central body. The plurality of buckets are configured to convert hydraulic energy from a stream of fluid into mechanical energy to rotate the turbine. Each bucket of the plurality of buckets includes a non-wetting surface with respect to the fluid.

Another example embodiment relates to a crankcase ventilation system for an internal combustion engine. The crankcase ventilation system includes a housing having an inlet receiving crankcase blowby gases to be filtered from the internal combustion engine and an outlet. The housing defines a central compartment. The crankcase ventilation system further includes a rotating coalescer element positioned within the central compartment and coupled to a drive shaft. The crankcase ventilation system includes a turbine coupled to the drive shaft. The turbine is configured to rotate the rotating coalescer element during operation of the crankcase ventilation system. The turbine includes a central body and a plurality of buckets coupled to the central body. The plurality of buckets are configured to convert hydraulic energy from a stream of fluid into mechanical energy to rotate the turbine. Each bucket of the plurality of buckets includes a non-wetting surface with respect to the fluid.

In yet another set of embodiments, a method comprises providing a housing defining an inlet, an outlet and a central compartment. A drive shaft is positioned in the central compartment of the housing. A rotating coalescer element is coupled to the drive shaft. A turbine having a central body and a plurality of buckets coupled thereto is provided. Each bucket of the plurality of buckets includes a non-wetting surface with respect to a fluid. The turbine is coupled to the drive shaft. The plurality of buckets are configured to convert hydraulic energy from a stream of the fluid into mechanical energy to rotate the turbine.

These and other features, together with the organization and manner of operation thereof, will become apparent from the following detailed description when taken in conjunction with the accompanying drawings, wherein like elements have like numerals throughout the several drawings described below.

BRIEF DESCRIPTION OF THE FIGURES

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Referring to the figures generally, various arrangements of a turbine for a rotating element are described. The rotating element may be, for example, a rotating coalescer element of a crankcase ventilation system for an internal combustion engine, a centrifugal separator (e.g., liquid-particle separators), or the like. In some arrangements, the turbine is an impulse turbine, which is also known as a pelton turbine or a turgo turbine. The turbine is used to convert hydraulic power from a stream of pressurized fluid to mechanical power that is used to drive the rotating element. The turbine includes a non-wetting surface (e.g., an oleophobic or hydrophobic surface) that repels the pressurized fluid. The non-wetting surface may be achieved through plasma coating, fluoropolymer coating, micro-topography features, and the like. The non-wetting surface increases the power transmission efficiency from the stream of pressurized fluid to the turbine, thereby increasing the rotational speed of the rotating element compared to wettable surfaced turbines, which in turn increases the efficiency of the rotating element.

Figure 1:
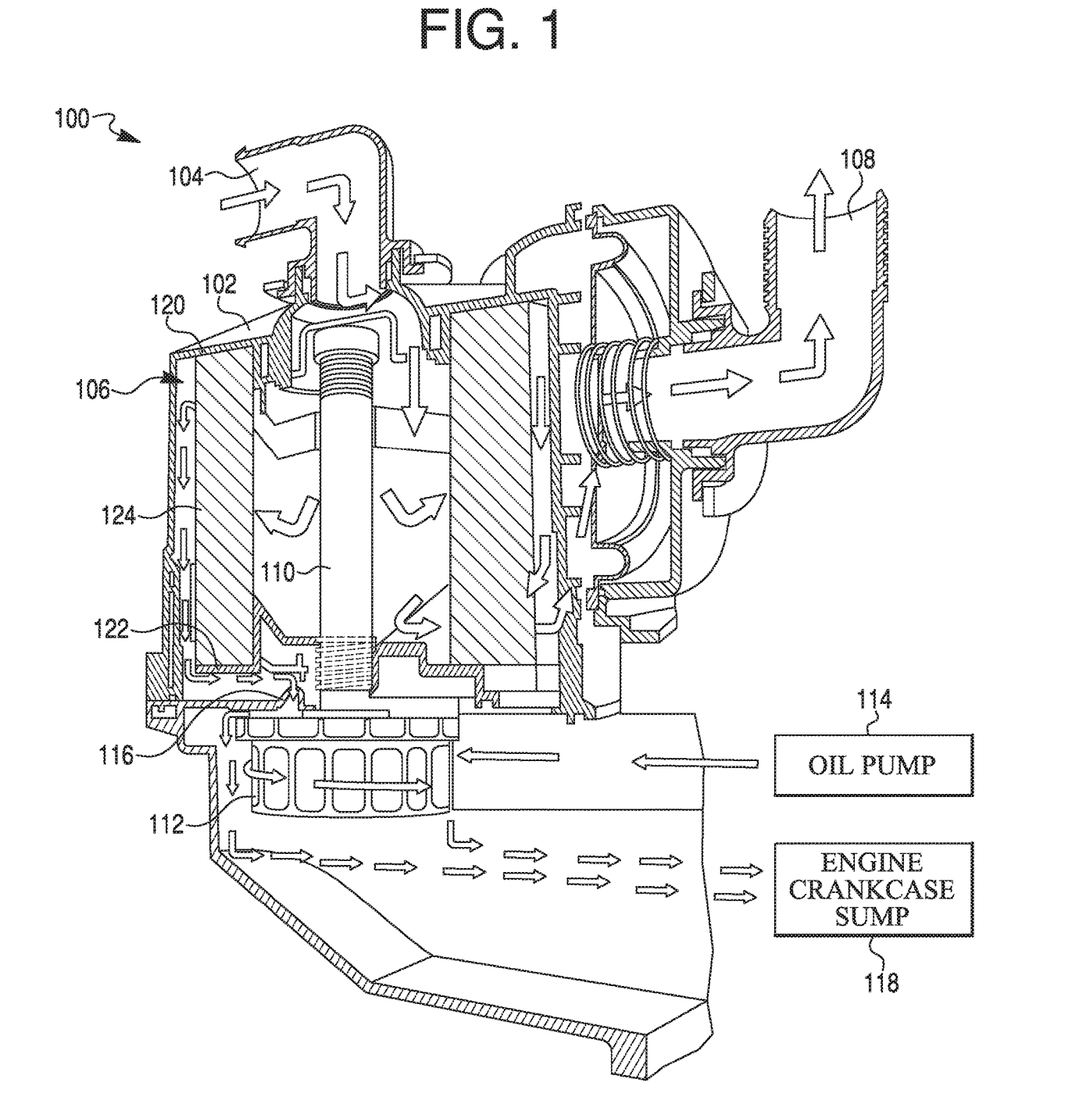
FIG. 1 shows a cross-sectional view of a crankcase ventilation system according to an example embodiment.

Referring to FIG. 1, a cross-sectional view of a crankcase ventilation system 100 is shown according to an example embodiment. The crankcase ventilation system 100 is used to describe the basic operations of a system that includes a rotating element driven by a pressurized fluid. The crankcase ventilation system 100 generally processes blowby gases received from an internal combustion engine crankcase to remove aerosols, oils, and other particulate contained in the crankcase blowby gases. The crankcase ventilation system 100 generally includes a housing 102 having an inlet 104 that receives crankcase blowby gases to be filtered (e.g., from a crankcase of an internal combustion engine), a central compartment having a rotating coalescer element 106 installed therein, and an outlet 108 that provides filtered blowby gases to the internal combustion engine (in a closed crankcase ventilation system) or to the ambient (in an open crankcase ventilation system).

During operation of the crankcase ventilation system 100, blowby gases enter the housing 102 through the inlet 104. The blowby gases are directed to the central compartment where the blowby gases flow through the rotating coalescer element 106 in an inside-out manner. In an alternate arrangement, the crankcase ventilation system 100 can be configured to have an outside-in flow arrangement. The rotating coalescer element 106 is coupled to a central shaft 110 that transfers rotation to the rotating coalescer element 106. The central shaft 110 is rotationally driven by a turbine 112 that is rotated by a jet of oil generated by an oil pump 114. The turbine 112 is an impulse turbine, which is also known as a pelton turbine or a turgo turbine. As the rotating coalescer element 106 rotates, the rotating coalescer element 106 separates oil, aerosols, and other contaminants contained in the blowby gases. The separated contaminants drain from the housing 102 through a drain 116 and return to the engine crankcase sump 118. The rotating coalescer element 106 generally includes a first endcap 120, a second endcap 122, and a separating device 124. The separating device 124 may comprise any combination of filter media, stacks of separating cones, and/or stacks of separating discs.

Still referring to FIG. 1, the turbine 112 converts the hydraulic power from the jet of oil into mechanical power to turn the central shaft 110. Generally, it is desirable for the turbine 112 to achieve the highest rotational speed possible for any given constrained power input to maximize the performance of the rotating coalescer element 106 (as well as provide reduced or negative pressure drop of flow through rotating coalescer element 106). Power input to the turbine 112 is limited by the pressure of the jet of oil created by the oil pump 114 multiplied by the allowable flowrate through a nozzle directing the jet into the turbine 112. In some arrangements, the power available to the turbine 112 is in the range of 20-120 watts. The power output from the turbine 112 to the central shaft 110 is equal to the efficiency of the turbine 112 multiplied by the power input. As a non-limiting example, if the efficiency of the turbine 112 is 50%, and the power input is 20-120 watts, power output to the rotating shaft 110 would range from 10-60 watts. Accordingly, to achieve a higher power output from the turbine 112 without increasing the power input, the efficiency of the turbine 112 needs to be increased. Various arrangements of the turbine 112 having features that increase the efficiency of the turbine 112 are described in further detail below with respect to FIGS. 2 through 7.

Figure 2:
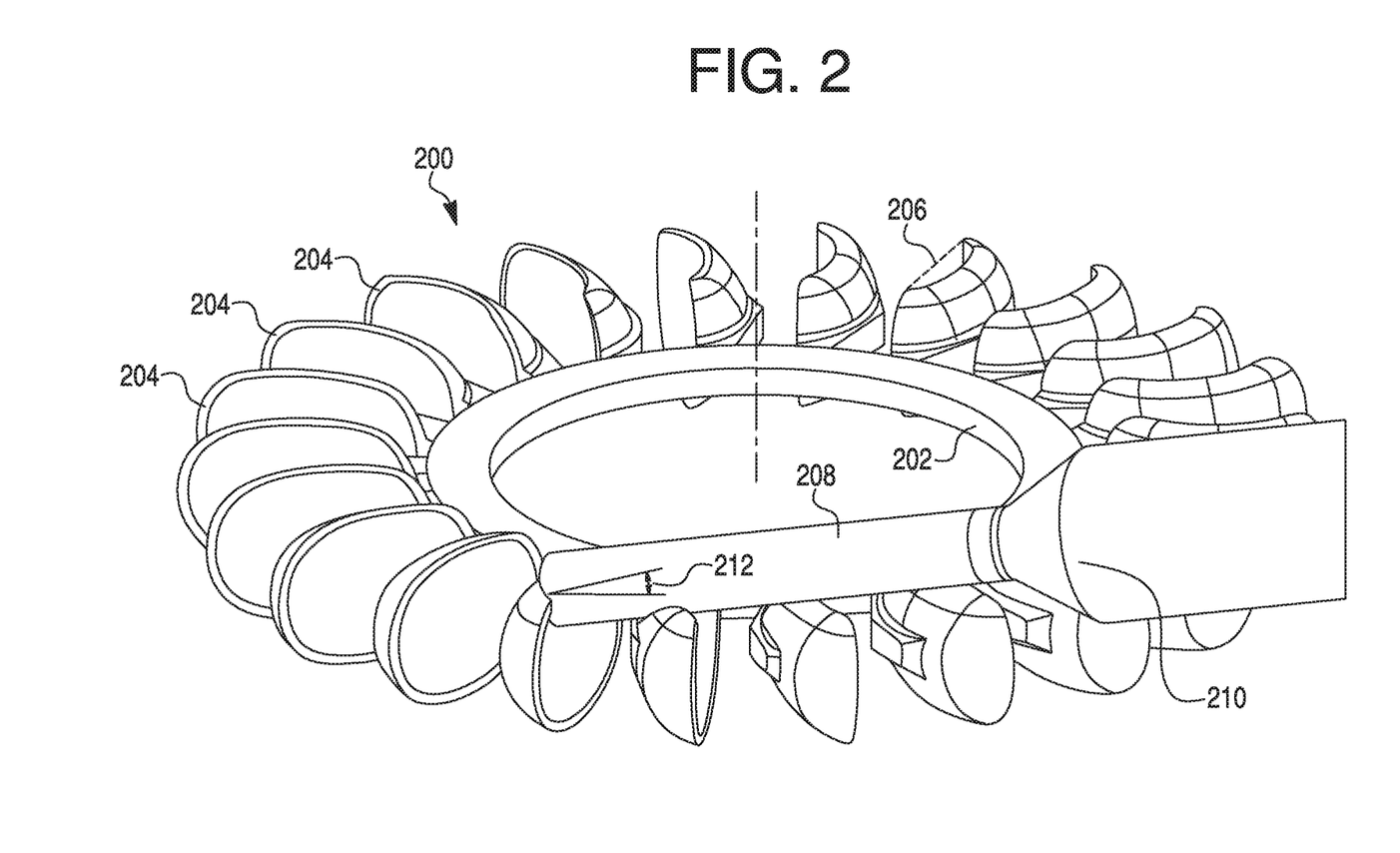
FIG. 2 shows a perspective view of a turbine according to an example embodiment.

Referring to FIG. 2, a perspective view of a turbine 200 is shown according to an example embodiment. The turbine 200 may be used in place of the turbine 112 of the crankcase ventilation system 100. The turbine 200 is a turgo-style turbine. The turbine 200 includes a central body 202 and a plurality of buckets 204 coupled to the central body 202. As used herein, the term "bucket" refers to a structure having a surface that is structured to be impacted by a stream of fluid so as to at least convert hydraulic power of the stream of fluid into mechanical power (i.e., rotation). The structure of the "bucket" can include, but is not limited to, bowled surfaces, cupped surfaces, planar surfaces, curved surfaces, or the like. In FIG. 2, the buckets 204 are generally bowl shaped. The central body 202 is generally ring shaped, and each of the buckets 204 extends from an outer periphery of the central body 202. The central body 202, for example, may be coupled to the central shaft 110 of the crankcase ventilation system 100. Each of the buckets 204 includes a cutaway 206 positioned at a first end of the bucket 204. The cutaway 206 provides for a crescent-shaped top-profile of each bucket 204 (from the right-side up perspective of FIG. 2). The cutaway 206 forms an opening in each bucket 204 thereby allowing for a stream of fluid 208 to be directed into each of the buckets 204 by a nozzle 210 at a finite approach angle 212 from above (or below) the buckets 204 as shown in FIG. 2. The finite approach angle 212 may be between fifteen and twenty degrees. In some arrangements, the nozzle 210 is supplied by the oil pump 114 of the crankcase ventilation system 100 and the fluid 208 is oil. As described in further detail below, the inner surface of each bucket 204 (i.e., the surface impacted by the stream of fluid 208) is a non-wetting (i.e., phobic) surface that repels the fluid 208.

Figure 3:
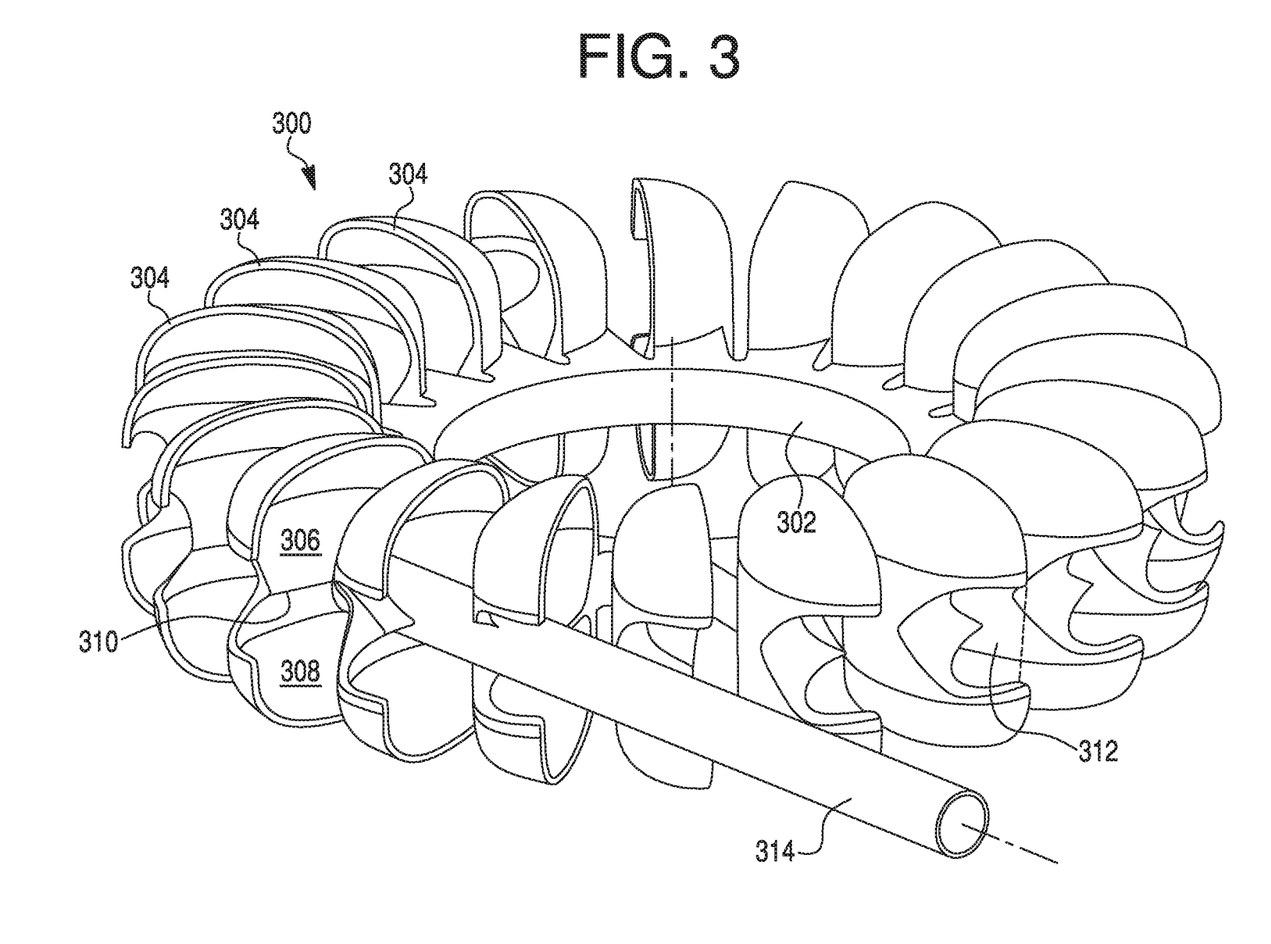
FIG. 3 shows a perspective view of a turbine according to another example embodiment.

Referring to FIG. 3, a perspective view of a turbine 300 is shown according to another example embodiment. The turbine 300 may be used in place of the turbine 112 of the crankcase ventilation system 100. The turbine 300 is a pelton-style turbine having a split bucket arrangement. The turbine 300 includes a central body 302 and a plurality of buckets 304 coupled to the central body 302. The central body 302 is generally ring shaped, and each of the buckets 304 extends from an outer periphery of the central body 302. The central body 302, for example, may be coupled to the central shaft 110 of the crankcase ventilation system 100. Each of the buckets 304 is a split bucket having a first bucket portion 306 and a second bucket portion 308 divided by a ridge 310. Each of the first bucket portion 306 and the second bucket portion 308 are generally bowl shaped. Each of the buckets 304 includes a cutaway 312 positioned at an outer side (i.e., the outer periphery of the turbine 300) of the bucket 304. The cutaway 312 is centered about the ridge 310 and forms an opening in each bucket 304 thereby allowing for a stream of fluid 314 to be directed into a center of each of the buckets 304 by a nozzle (e.g., the nozzle 210) such that the stream of fluid 314 is split by the ridge 310 and directed into the first and second bucket portions 306 and 308. In some arrangements, the nozzle is supplied by the oil pump 114 of the crankcase ventilation system 100 and the fluid 314 is oil. As described in further detail below, the inner surface of each bucket 304 (i.e., the surface impacted by the stream of fluid 314) is a non-wetting (i.e., phobic) surface that repels the fluid 314.

Figure 4:
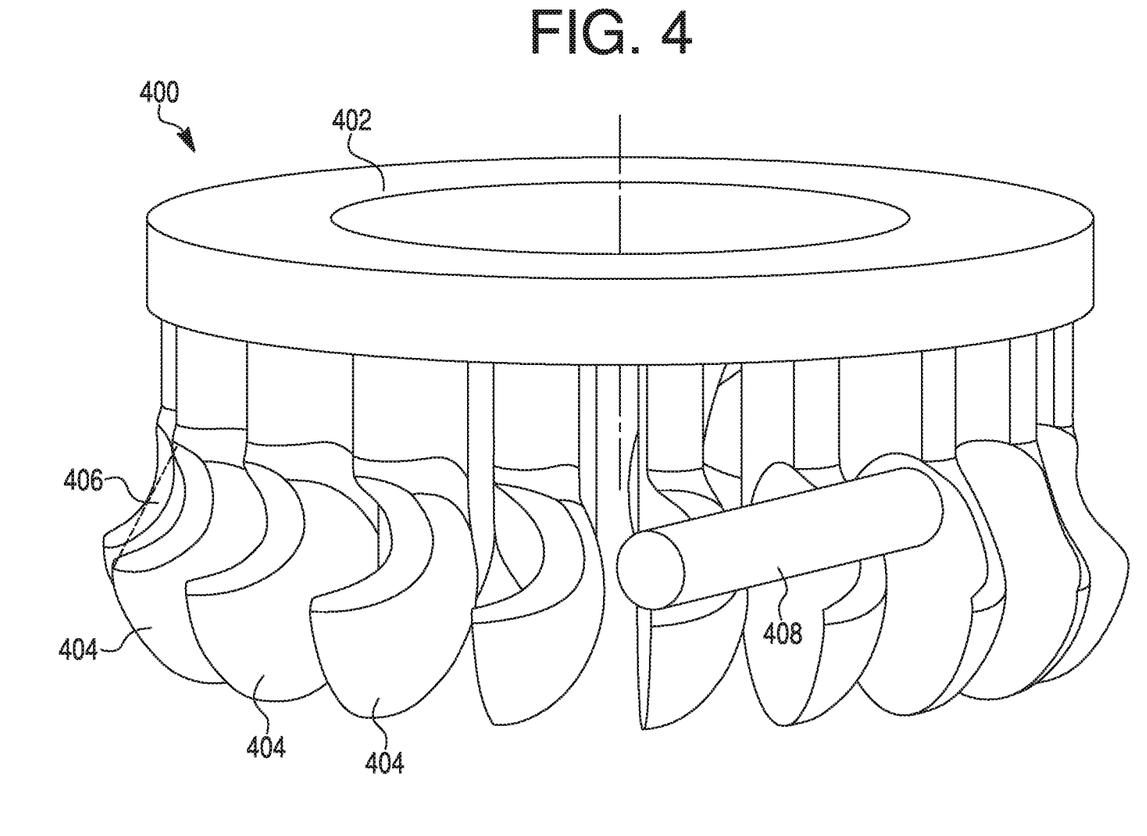
FIG. 4 shows a perspective view of a turbine according to a further example embodiment.

Referring to FIG. 4, a perspective view of a turbine 400 is shown according to still another example embodiment. The turbine 400 may be used in place of the turbine 112 of the crankcase ventilation system 100. The turbine 400 is a modified single-bucket pelton-style turbine having a tangential jet and top-entrance bottom-discharge arrangement. The turbine 400 includes a central body 402 and a plurality of buckets 404 coupled to the central body 402. The central body 402 is generally ring shaped, and each of the buckets 404 extends from an axial surface of the central body 402. The central body 402, for example, may be coupled to the central shaft 110 of the crankcase ventilation system 100. Each of the buckets 404 is generally bowl shaped. Each of the buckets 404 includes a cutaway 406 positioned at an upper outer side of the bucket 404. In some arrangements, the cutaway 406 is positioned adjacent to a support connecting the bucket 404 to the central body 402. In some arrangements, the cutaway 406 provides for a crescent-shaped profile for each bucket 404. The cutaway 406 is sized and shaped to allow for a stream of fluid 408 to be directed into a center of each of the buckets 404 by a nozzle (e.g., the nozzle 210). The bucket 404 then directs the fluid out the opposite side (i.e., the lower side) of the bucket 404 by turning (i.e., routing) the fluid along the curved surface of the bucket 404 that is impacted by the stream of fluid 408. In some arrangements, the nozzle is supplied by the oil pump 114 of the crankcase ventilation system 100 and the fluid 408 is oil. As described in further detail below, the inner surface of each bucket 404 (i.e., the surface impacted by the stream of fluid 408) is a non-wetting (i.e., phobic) surface that repels the fluid 408.

Figure 5:
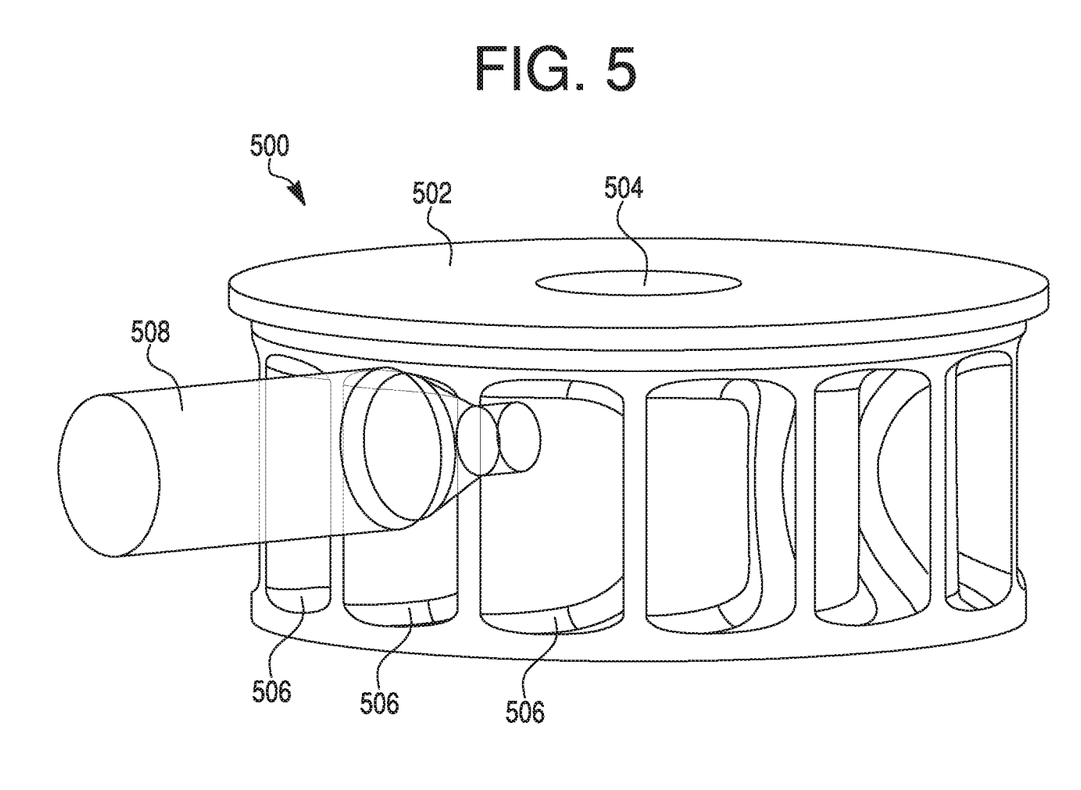
FIG. 5 shows a perspective view of a turbine according to another example embodiment.

Referring to FIG. 5, a perspective view of a turbine 500 is shown according to another example embodiment. The turbine 500 may be used in place of the turbine 112 of the crankcase ventilation system 100. The turbine 500 is a modified pelton-style turbine having a spiral shaped bucket arrangement. The turbine 500 includes a cylindrical body 502 having a central opening 504. The cylindrical body 502 includes a plurality of buckets 506 formed on the peripheral surface of the cylindrical body 502. The cylindrical body 502, for example, may be coupled to the central shaft 110 of the crankcase ventilation system 100. Each of the buckets 506 in the embodiment of FIG. 5 is spiral shaped. Each of the buckets 506 are formed as depressions on a radial surface of the cylindrical body 502. The spiral shape of the buckets 506 is structured to receive a stream of fluid from a nozzle 508 at a top portion of the bucket 506 (e.g., as shown by the positioning of the nozzle 508 in FIG. 5), to turn the fluid along the curved surface of the bucket 506 created by the spiral shape, and to direct the fluid out of a bottom portion of the bucket 506. In some arrangements, the nozzle 508 is supplied by the oil pump 114 of the crankcase ventilation system 100 and the fluid is oil. As described in further detail below, the inner surface of each bucket 506 (i.e., the surface impacted by the stream of fluid) is a non-wetting (i.e., phobic) surface that repels the fluid.

Figure 6:
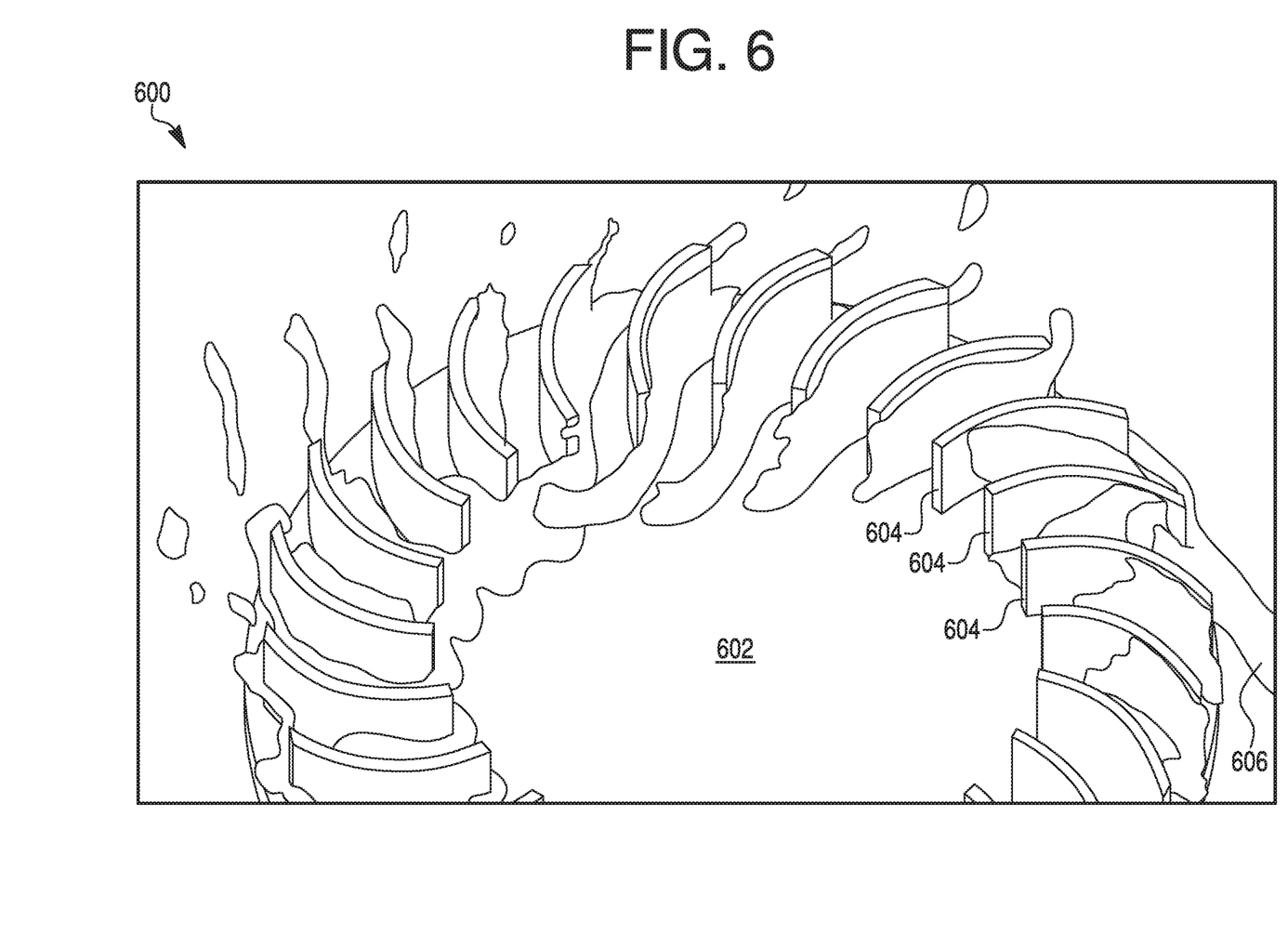
FIG. 6 is a computational dynamic simulation showing a perspective view of a portion of a turbine according to a further example embodiment.

Referring to FIG. 6, a CFD simulation showing a perspective view of a portion of a turbine 600 is shown according to still another example embodiment. The turbine 600 may be used in place of the turbine 112 of the crankcase ventilation system 100. The turbine 600 is a Banki cross-flow turbine. The turbine 600 includes a cylindrical body 602 having a plurality of buckets 604 projecting from the cylindrical body 602. The cylindrical body 602, for example, may be coupled to the central shaft 110 of the crankcase ventilation system 100. Each of the buckets 604 in the embodiment of FIG. 6 is defined by a curved surface. The plurality of buckets 604 form a plurality of curved channels from an outer periphery of the cylindrical body 602 extending towards the center of the cylindrical body 602. The channels are arranged to receive a stream of fluid 606 from a nozzle (e.g., the nozzle 210) and to turn the fluid towards the center of the cylindrical body 602 along the curved surface. In some arrangements, the nozzle is supplied by the oil pump 114 of the crankcase ventilation system 100 and the fluid 606 is oil. As described in further detail below, the buckets 604 that are impacted by the stream of fluid 606 are a non-wetting (i.e., phobic) and repel the fluid.

Figure 7:
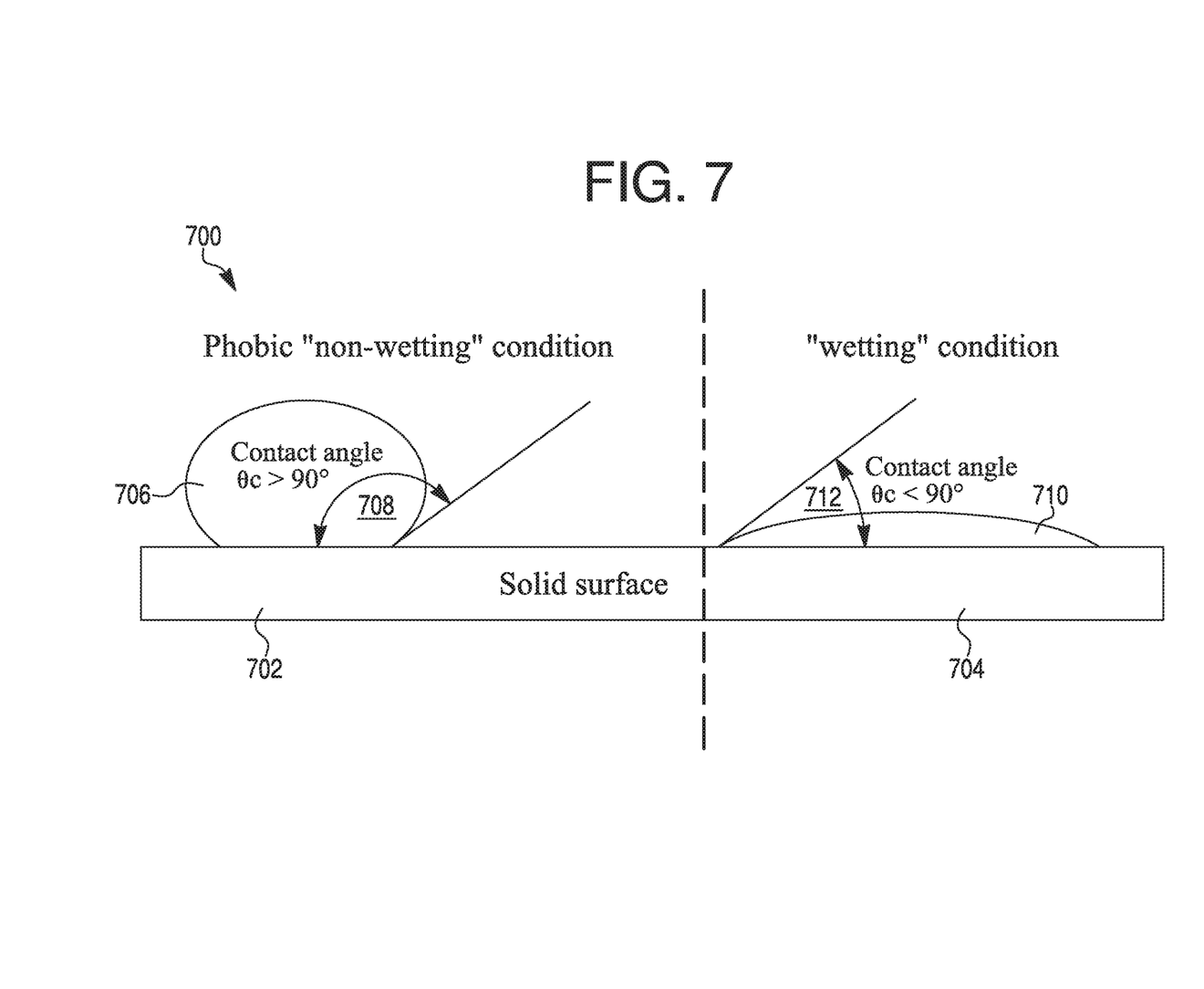
FIG. 7 shows a cross-sectional view of drops of fluid interacting with a surface having both a non-wetting portion and a wetting portion.

As described above, each of the above described turbines 200, 300, 400, 500, and 600 includes non-wetting (i.e., phobic) surfaces where the fluid (e.g., the oil) impacts the turbine. In arrangements where the fluid is oil, the surfaces are oleophobic. In arrangements where the fluid is water, the surfaces are hydrophobic. FIG. 7 highlights difference between how a fluid reacts with a wetting surface and a non-wetting surface. As shown in FIG. 7, a surface 700 has both a non-wetting (i.e., phobic) portion 702 and a wetting portion 704. A first drop of fluid 706 is shown on the non-wetting portion 702. The first drop of fluid 706 forms a first contact angle 708 with respect to the surface 700. The first contact angle 708 is greater than 90°. In some arrangements, the first contact angle 708 is as high as 150°. A second drop of fluid 710 is shown on the wetting portion 704. The second drop of fluid 710 forms a second contact angle 712 with respect to the surface 700. The second contact angle 712 is less than 90°. In some arrangements, the second contact angle 712 is as less than 20°. Accordingly, the first drop of fluid 706 clings to the non-wetting portion 702 less than the second drop of fluid 710 clings to the wetting portion 704.

The non-wetting (i.e., phobic) surfaces of the turbines 200, 300, 400, 500, and 600 may be formed by any combination of processes. The contact angle between liquid droplet and surface is determined by the adhesive and cohesive forces within fluid and surface, and depends substantially upon the free energy of solid surface, along with the surface tension of liquid itself. In some arrangements, non-wetting coatings provide the non-wetting characteristic by reducing the solid's surface free energy. For example, the weak molecular crystal structure of fluorocarbons, where the molecules are held together by physical forces (van der Waals, etc.), tend to have very "low energy" and tend to be "non-wetting." In some arrangements, the non-wetting surfaces are formed by plasma coating the surfaces, chemical coating the surfaces (e.g., with fluoropolymers such as perfluoropolyether, silanes, etc.), creating surface micro-scale topography on the surface (i.e., similar to the "lotus effect" whereby lotus leaf surfaces contain multi-scale structures including bumps of about 10-50 micron in size that repel water by trapping air between the water and the surface of the lotus leaves), or a combination thereof. In some arrangements, evaporative-based chemical coatings (containing proprietary polymers, fluorosolvents, fluoropolymers, and alkanes) can be applied by dipping, wiping, or spraying processes, and deposit a durable coating (e.g., via covalent bonding between coating and surface) of reported thickness ranging from 5 to 500 nanometers depending upon process chosen. Other deposition processes rely on vacuum or vapor deposition methods. The aforementioned coatings result in reported water and oil contact angles exceeding 70° and perhaps even 130° as measured by a goniometer. The methods typically form a phobic mono-layer on top of a dielectric adhesion layer bonded to the polymeric substrate.

Figure 8:
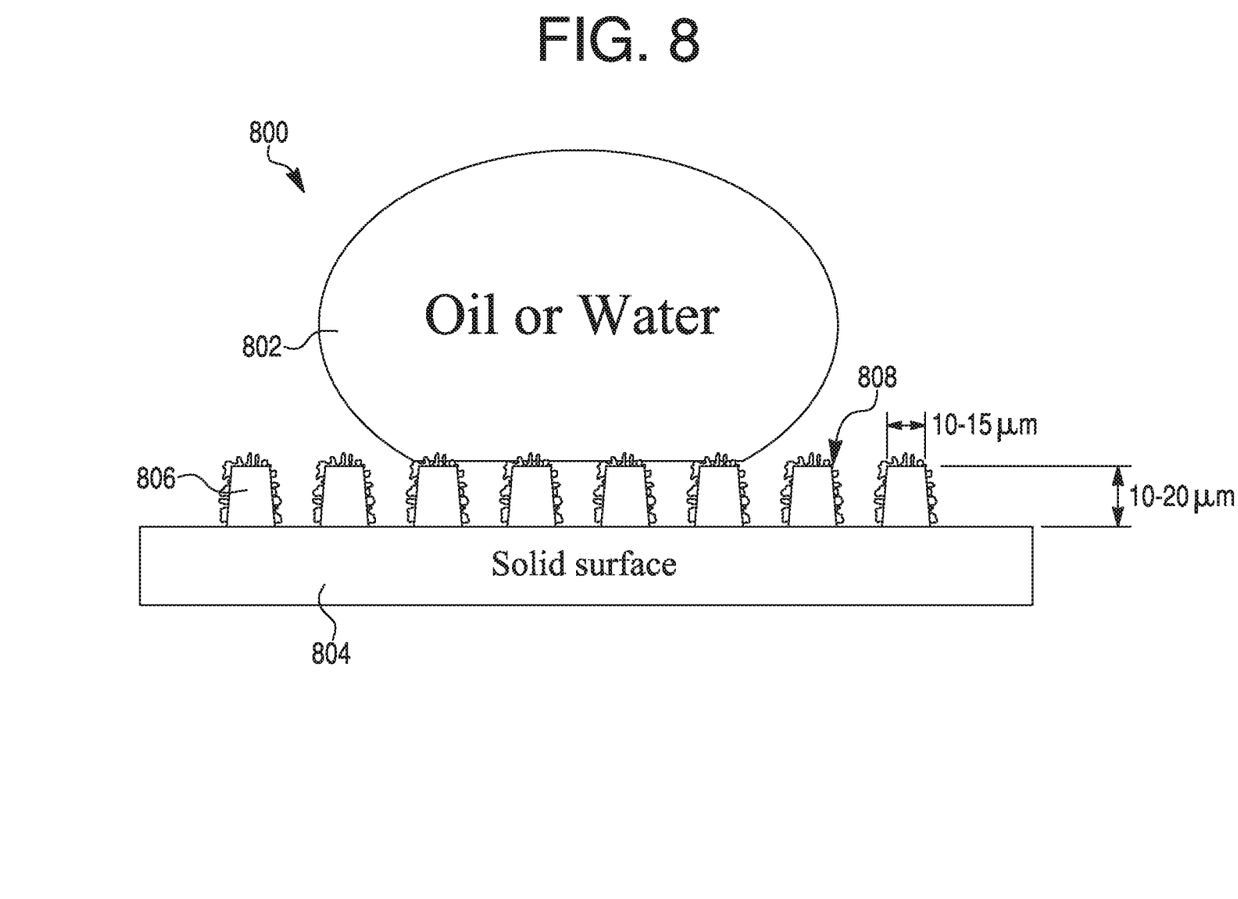
FIG. 8 shows a view of a droplet (e.g., of oil or water) that is elevated from a solid surface (e.g., a turbine) by a plurality of projections according to an example embodiment.

In an alternate arrangement, the non-wetting surfaces of the turbines 200, 300, 400, 500, and 600 can be achieved by creating micron and nanoscale topographic surface roughness which acts to trap air beneath the liquid droplet. These surfaces can be created on top of existing substrate surface (i.e. the plastic or metal turbine buckets) using sol-gel processes in which silanes are modified with certain chemicals (e.g., fluorine compounds) and dispersed as "sol" of nanoscale particles in colloid solution. The solution evaporates and the particles form a dense micro-rough structure adhering to surface that repel the liquid from the solid surface of the turbines. This creates a lotus effect, which is illustrated in FIG. 8. FIG. 8 shows a view of a droplet 802 (e.g., of oil or water) that is elevated from a solid surface 804 (e.g., a turbine) by a plurality of projections 806. In some arrangements, the projections 806 are microscale projections that are 10-15 micrometers wide and extend 10-20 micrometers from the solid surface 804. The projections 806 trap pockets of air between the solid surface 804 and the droplet 802, which helps to repel the droplet 802 from the solid surface 804. The projections 806 include nanoscale surface roughness 808 that further enhances the lotus effect.

Figure 9:
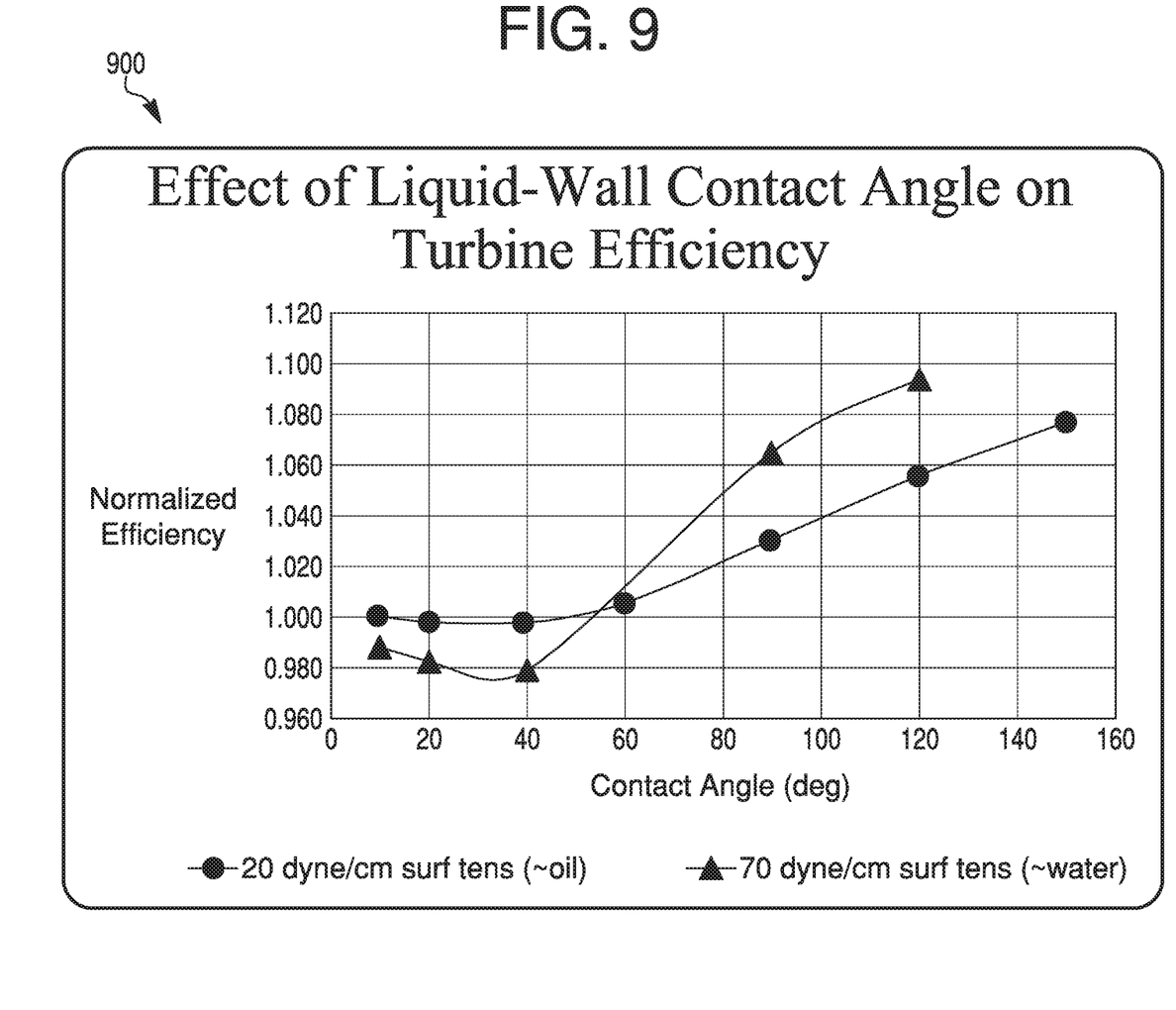
FIG. 9 shows a graph of how increasing contact angles impacts the efficiencies of typical impulse turbine designs for different fluids.

By utilizing non-wetting surfaces of the turbines 200, 300, 400, 500, and 600, the efficiencies of the turbines 200, 300, 400, 500, and 600 improves by approximately two and a half to eight percent (depending on the fluid, the size of the turbine, the alignment of the stream of fluid with respect to the turbine, the arrangement of the turbine, the pressure of the stream of fluid, and the like). The increased performance is at least partially the result of the reduced clinging of the fluid on the surfaces of the turbines 200, 300, 400, 500, and 600. The increased efficiencies of the turbines 200, 300, 400, 500, and 600 results in increased power transmission from the jet of fluid to the rotating element (i.e., to the rotating coalescer element 106 of the crankcase ventilation system 100). The increased efficiency is plotted in FIG. 9, which shows a graph 900 of how increasing contact angles (e.g., by reducing the surface free energy by coating/treatment as described above) impacts the hydraulic efficiencies of typical impulse turbine designs for fluids of varying surface tension (e.g., oil at about 20 dyne/cm and water at about 70 dyne/cm).

Figure 10:
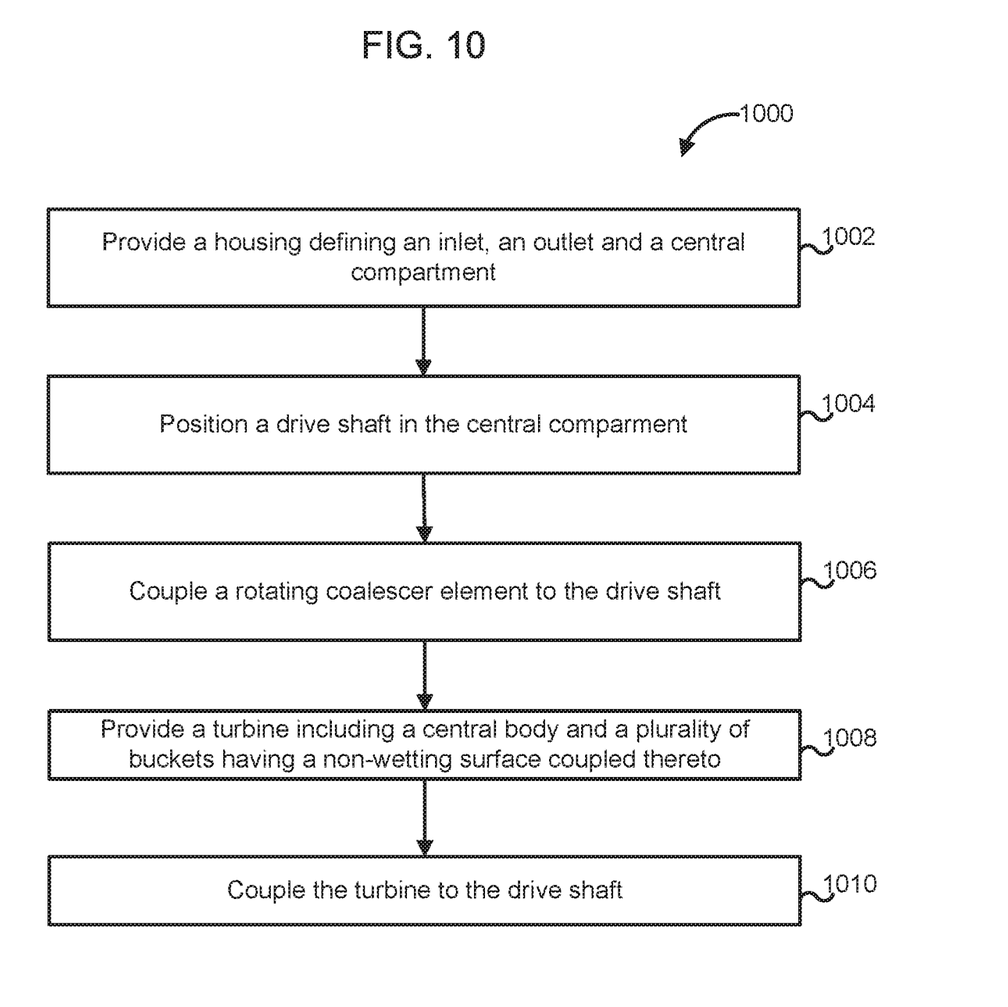
FIG. 10 is a schematic flow diagram of a method for fabricating a crankcase ventilation system, according to an embodiment.

FIG. 10 is a schematic flow diagram of an example method 1000 for fabricating a crankcase ventilation system (e.g., the crankcase ventilation system 100), according to an embodiment. The method 1000 comprises providing a housing defining an inlet, an outlet and a central compartment, at 1002. For example, the housing may include the housing 102 of the crankcase ventilation system 100, having the central compartment and defining the inlet 104 and the outlet 108.

A drive shaft is positioned in the central compartment of the housing, at 1004. For example, the central shaft 110 is positioned in the central compartment. A rotating coalescer element is coupled to the drive shaft, at 1006. For example, the rotating coalescer element 106 or any other suitable rotatable element is coupled to the central shaft 110. The drive shaft is free to rotate within the central compartment so as to transfer rotational motion to the rotating coalescer element coupled thereto.

A turbine is provided, at 1008. The turbine includes a central body and a plurality of buckets coupled thereto. The plurality of buckets are configured to convert hydraulic energy from a stream of a fluid into mechanical energy to rotate the turbine. The turbine may include, for example the turbine 200, 300, 400, 500, 600 or any other turbine described herein. Furthermore, each of the plurality of buckets of the turbine includes a non-wetting surface with respect to the fluid.

The non-wetting surface may be formed using any suitable process. In some embodiments, the non-wetting surface is formed by plasma coating the non-wetting surface. In other embodiments, the non-wetting surface is formed by chemical coating the non-wetting surface. In yet another embodiment, the non-wetting surface is formed by creating surface micro-scale topography roughness on the non-wetting surface. In still other embodiments, the non-wetting surface is formed by a combination of at least two of plasma coating the non-wetting surface, chemical coating the non-wetting surface, or creating surface micro-scale topography roughness on the non-wetting surface. In particular embodiments, the fluid used to drive the turbine is oil. In such embodiments, the non-wetting surface may include an oleophobic surface.

The turbine is coupled to the drive shaft, at 1010 For example the central body (e.g., the central body 202, 302, 402, 502, 602) of the turbine (e.g., the turbine 200, 300, 400, 500, 600) is operably coupled to the central shaft 110 such that any rotation of the turbine rotates the drive shaft and thereby, the rotating coalescer element.

It should be noted that any use of the term "example" herein to describe various embodiments is intended to indicate that such embodiments are possible examples, representations, and/or illustrations of possible embodiments (and such term is not intended to connote that such embodiments are necessarily extraordinary or superlative examples).

As used herein, the term "approximately" is intended to encompass a range of about plus or minus 5% of the designated number or range of numbers.

References herein to the positions of elements (e.g., "top," "bottom," "above," "below," etc.) are merely used to describe the orientation of various elements in the FIGURES. It should be noted that the orientation of various elements may differ according to other example embodiments, and that such variations are intended to be encompassed by the present disclosure.

The terms "coupled" and the like as used herein mean the joining of two members directly or indirectly to one another.

Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various example embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Additionally, features from particular embodiments may be combined with features from other embodiments as would be understood by one of ordinary skill in the art. Other substitutions, modifications, changes and omissions may also be made in the design, operating conditions and arrangement of the various example embodiments without departing from the scope of the present invention.

While this specification contains many specific implementation details, these should not be construed as limitations on the scope of any embodiment or of what may be claimed, but rather as descriptions of features specific to particular implementations of particular embodiments. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A turbine comprising:
a central body; and
a plurality of buckets coupled to the central body, the plurality of buckets configured to convert hydraulic energy from a stream of fluid into mechanical energy to rotate the turbine, each bucket of the plurality of buckets includes a non-wetting surface with respect to the fluid.

2. The turbine of claim 1, wherein the fluid is oil, and wherein the non-wetting surface is an oleophobic surface.

3. The turbine of claim 1, wherein each bucket of the plurality of buckets includes a cutaway.

4. The turbine of claim 1, wherein the turbine is a pelton-style turbine, a turgo-style turbine, a pelton-style turbine having a split bucket arrangement, a single-bucket pelton-style turbine, a pelton-style turbine with spiral shaped buckets or a Banki cross-flow turbine.

5. The turbine of claim 1, wherein the non-wetting surface is formed by plasma coating the non-wetting surface.

6. The turbine of claim 1, wherein the non-wetting surface is formed by chemical coating the non-wetting surface.

7. The turbine of claim 1, wherein the non-wetting surface is formed by creating surface micro-scale topography roughness on the non-wetting surface.

8. The turbine of claim 1, wherein the non-wetting surface is formed by a combination of at least two of plasma coating the non-wetting surface, chemical coating the non-wetting surface, or creating surface micro-scale topography roughness on the non-wetting surface.

9. A crankcase ventilation system for an internal combustion engine, the crankcase ventilation system comprising:
a housing having an inlet receiving crankcase blowby gases to be filtered from the internal combustion engine and an outlet, the housing defining a central compartment;
a rotating coalescer element positioned within the central compartment and coupled to a drive shaft; and
a turbine comprising:
a central body operably coupled to the drive shaft, and
a plurality of buckets coupled to the central body, the plurality of buckets configured to convert hydraulic energy from a stream of fluid into mechanical energy to rotate the turbine and thereby, the rotating coalescer element, each bucket of the plurality of buckets includes a non-wetting surface with respect to the fluid.

10. The crankcase ventilation system of claim 9, wherein the fluid is oil, and wherein the non-wetting surface is an oleophobic surface.

11. The crankcase ventilation system of claim 9, wherein each bucket of the plurality of buckets includes a cutaway.

12. The crankcase ventilation system of claim 9, wherein the turbine is a pelton-style turbine, a turgo-style turbine, a pelton-style turbine having a split bucket arrangement, a single-bucket pelton-style turbine, a pelton-style turbine with spiral shaped buckets or a Banki cross-flow turbine.

13. The crankcase ventilation system of claim 9, wherein the non-wetting surface is formed by plasma coating the non-wetting surface.

14. The crankcase ventilation system of claim 9, wherein the non-wetting surface is formed by chemical coating the non-wetting surface.

15. The crankcase ventilation system of claim 9, wherein the non-wetting surface is formed by creating surface micro-scale topography roughness on the non-wetting surface.

16. The crankcase ventilation system of claim 9, wherein the non-wetting surface is formed by a combination of at least two of plasma coating the non-wetting surface, chemical coating the non-wetting surface, or creating surface micro-scale topography roughness on the non-wetting surface.

17. A method, comprising:
providing a housing, the housing defining an inlet, an outlet and a central compartment;
positioning a drive shaft in the central compartment of the housing;
coupling a rotating coalescer element to the drive shaft;
providing a turbine having a central body and a plurality of buckets coupled thereto, each bucket of the plurality of buckets including a non-wetting surface with respect to a fluid; and
coupling the turbine to the drive shaft, wherein the plurality of buckets are configured to convert hydraulic energy from a stream of the fluid into mechanical energy to rotate the turbine.

18. The method of claim 17, wherein the non-wetting surface is formed by plasma coating the non-wetting surface.

19. The method of claim 17, wherein the non-wetting surface is formed by chemical coating the non-wetting surface.

20. The method of claim 17, wherein the non-wetting surface is formed by creating surface micro-scale topography roughness on the non-wetting surface.

21. The method of claim 17, wherein the non-wetting surface is formed by a combination of at least two of plasma coating the non-wetting surface, chemical coating the non-wetting surface, or creating surface micro-scale topography roughness on the non-wetting surface.

22. The method of claim 17, wherein the fluid is oil, and wherein the non-wetting surface is an oleophobic surface.

* * * * *